(12) United States Patent
Shimizu

(10) Patent No.: US 11,264,218 B2
(45) Date of Patent: Mar. 1, 2022

(54) SUBSTRATE PROCESSING APPARATUS AND CLEANING METHOD

(71) Applicant: TOKYO ELECTRON LIMITED, Tokyo (JP)

(72) Inventor: Wataru Shimizu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 16 days.

(21) Appl. No.: 16/778,724

(22) Filed: Jan. 31, 2020

(65) Prior Publication Data
US 2020/0251316 A1     Aug. 6, 2020

(30) Foreign Application Priority Data

Feb. 1, 2019 (JP) ............................. JP2019-016999

(51) Int. Cl.
*H01J 37/32*   (2006.01)
*H01L 21/67*   (2006.01)
*H01L 21/683*  (2006.01)

(52) U.S. Cl.
CPC .. *H01J 37/32853* (2013.01); *H01J 37/32449* (2013.01); *H01J 37/32458* (2013.01); *H01J 37/32715* (2013.01); *H01J 37/32834* (2013.01); *H01L 21/67069* (2013.01); *H01J 2237/334* (2013.01); *H01L 21/6833* (2013.01)

(58) Field of Classification Search
CPC ........... H01L 21/6719; H01L 21/67017; H01L 21/67069; H01L 21/6833; H01J 37/32449; H01J 37/32834; H01J 37/32458; H01J 37/32715; H01J 37/32853; H01J 2237/334

See application file for complete search history.

(56) References Cited

U.S. PATENT DOCUMENTS

| | | | | |
|---|---|---|---|---|
| 5,672,204 A | * | 9/1997 | Habuka | .................. C30B 25/14 117/204 |
| 6,132,552 A | * | 10/2000 | Donohoe | ............ C23C 16/4405 |
| 2003/0079686 A1 | * | 5/2003 | Chen | .................. C23C 16/4412 118/715 |

FOREIGN PATENT DOCUMENTS

JP     2009-290086 A     12/2009

\* cited by examiner

*Primary Examiner* — Yuechuan Yu
(74) *Attorney, Agent, or Firm* — Weihrouch IP

(57) ABSTRACT

An apparatus of processing a target substrate is provided. The apparatus includes a processing chamber having a substantially cylindrical inner space, a mounting table disposed in the processing chamber and configured to mount thereon the target substrate, at least one supply line configured to supply a gas in a direction along an inner wall surface of a sidewall of the processing chamber to generate a swirl flow of the gas in the processing chamber, and a ventilator configured to exhaust the gas from the processing chamber. Further, in a direction intersecting an axis of the substantially cylindrical inner space, a flow velocity of the gas in a first region close to the inner wall surface is higher than a flow velocity of the gas in a second region where the mounting table is disposed.

14 Claims, 8 Drawing Sheets

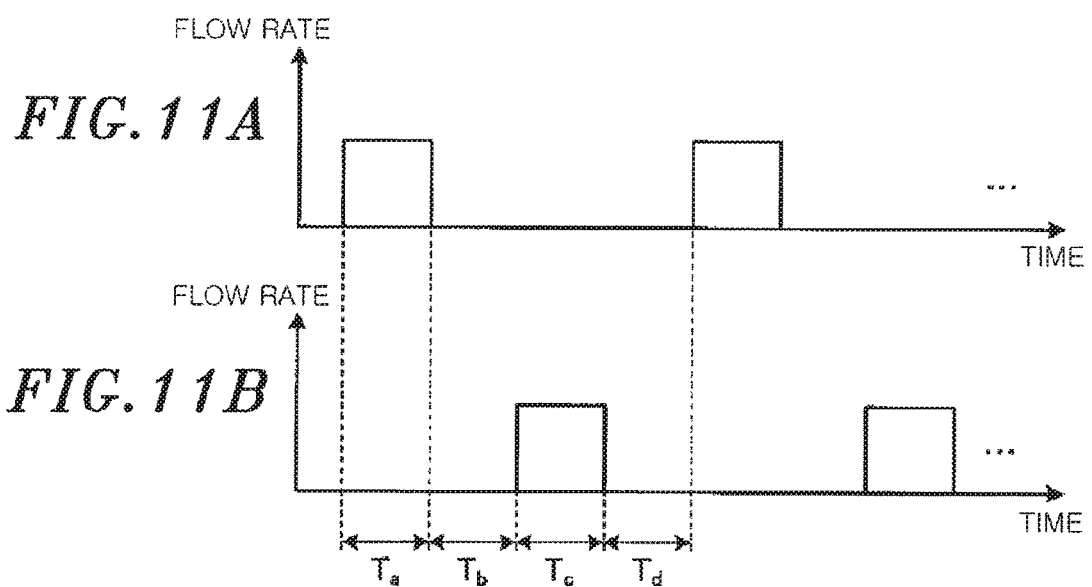

SUBSTRATE PROCESSING APPARATUS AND CLEANING METHOD

CROSS-REFERENCE TO RELATED APPLICATIONS

This application claims priority to Japanese Patent Application No. 2019-016999, filed on Feb. 1, 2019, the entire contents of which are incorporated herein by reference.

TECHNICAL FIELD

The present disclosure relates to a substrate processing apparatus and a cleaning method.

BACKGROUND

For example, Japanese Patent Application Publication No. 2009-290086 discloses a technique for removing reaction by-products (so-called deposits) adhered to an inner surface of a processing chamber due to a substrate processing by supplying a large amount of a purge gas into the processing chamber after the substrate processing. Such a technique is referred to as "non-plasma particle cleaning (NPPC)."

The present disclosure provides a substrate processing apparatus and a cleaning method capable of improving deposit-removal efficiency in a cleaning process.

SUMMARY

In accordance with an aspect of the present disclosure, there is provided an apparatus for processing a target substrate including: a processing chamber having a substantially cylindrical inner space; a mounting table disposed in the processing chamber and configured to mount thereon the target substrate; at least one supply line configured to supply a gas in a direction along an inner wall surface of a sidewall of the processing chamber to generate swirl flow of the gas in the processing chamber, the inner wall surface facing the substantially cylindrical inner space; and a ventilator configured to exhaust the gas from the processing chamber. Further, in a direction intersecting an axis of the substantially cylindrical inner space, a flow velocity of the gas in a first region close to the inner wall surface is higher than a flow velocity of the gas in a second region where the mounting table is disposed.

BRIEF DESCRIPTION OF THE DRAWINGS

The objects and features of the present disclosure will become apparent from the following description of embodiments, given in conjunction with the accompanying drawings, in which:

FIGS. 11A and 11B show examples of the flow rate control of the purge gas.

DETAILED DESCRIPTION

Hereinafter, embodiments of a substrate processing apparatus and a cleaning method of the present disclosure will be described in detail with reference to the accompanying drawings. The following embodiments are not intended to limit the substrate processing apparatus and the cleaning method of the present disclosure.

In a shower head for supplying a processing gas used for substrate processing, an arrangement and direction of gas injection holes for injecting the processing gas is predetermined in order to improve the processing uniformity on a surface of a substrate. Therefore, when a large amount of a purge gas is supplied into the processing chamber through the shower head, the purge-gas velocity is higher near a mounting surface of a mounting table on which the substrate is mounted but is lower near a sidewall of the processing chamber.

Reaction by-products (so-called deposits) generated in the processing chamber by the substrate processing are adhered to the sidewall of the processing chamber or the like. Therefore, even if a large amount of a purge gas is supplied into the processing chamber through the shower head, it is difficult to remove the deposits adhered to the sidewall of the processing chamber. Accordingly, it is required to frequently open the processing chamber and perform a cleaning process or the like, which makes it difficult to improve the throughput of the substrate processing.

Therefore, the present disclosure provides a technique capable of improving deposit-removal efficiency in the cleaning process.

First Embodiment

<Configuration of the Plasma Processing Apparatus 10>

Figure 1:
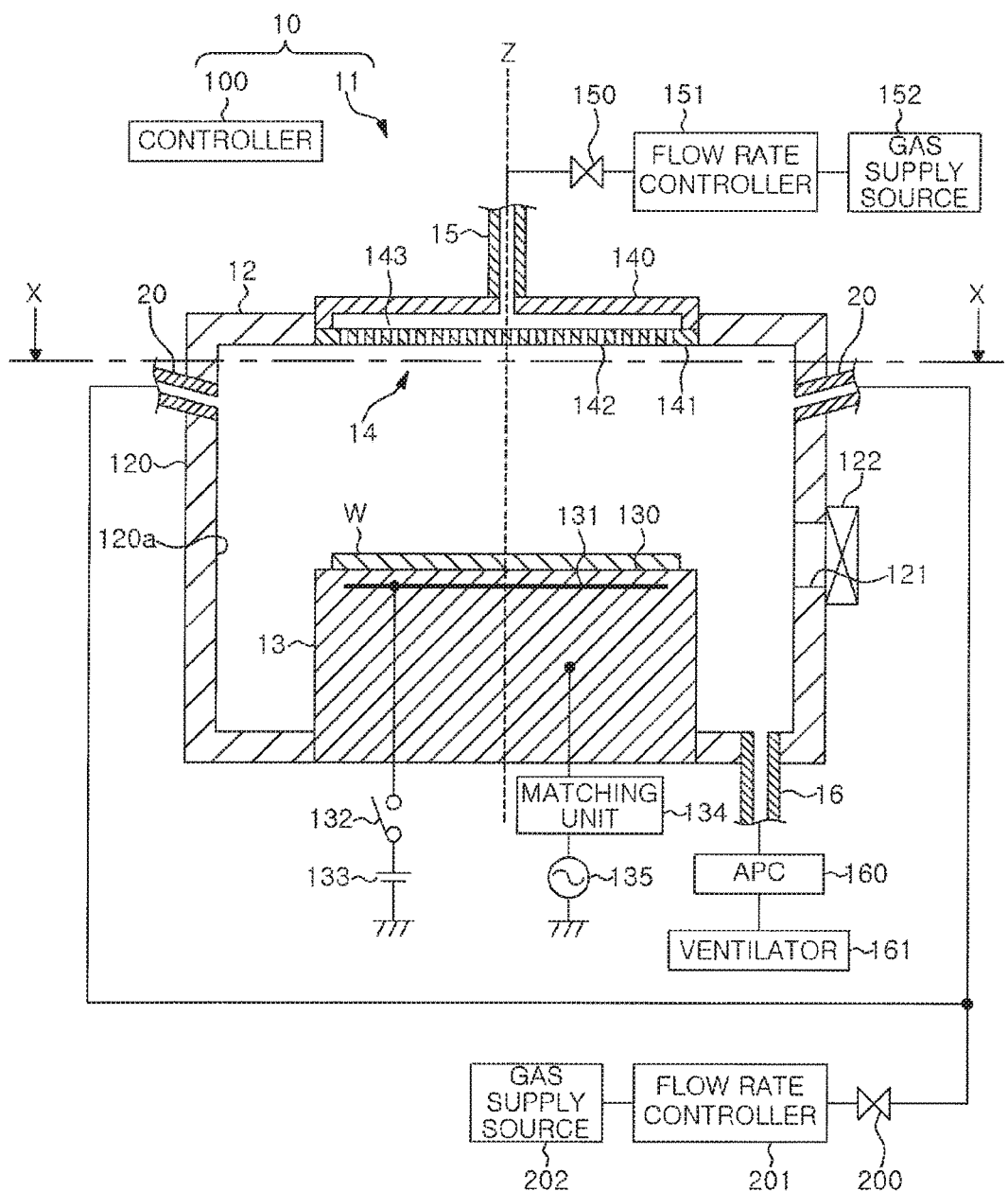
FIG. 1 is a schematic cross-sectional view showing an example of a plasma processing apparatus according to a first embodiment of the present disclosure.
Figure 2:
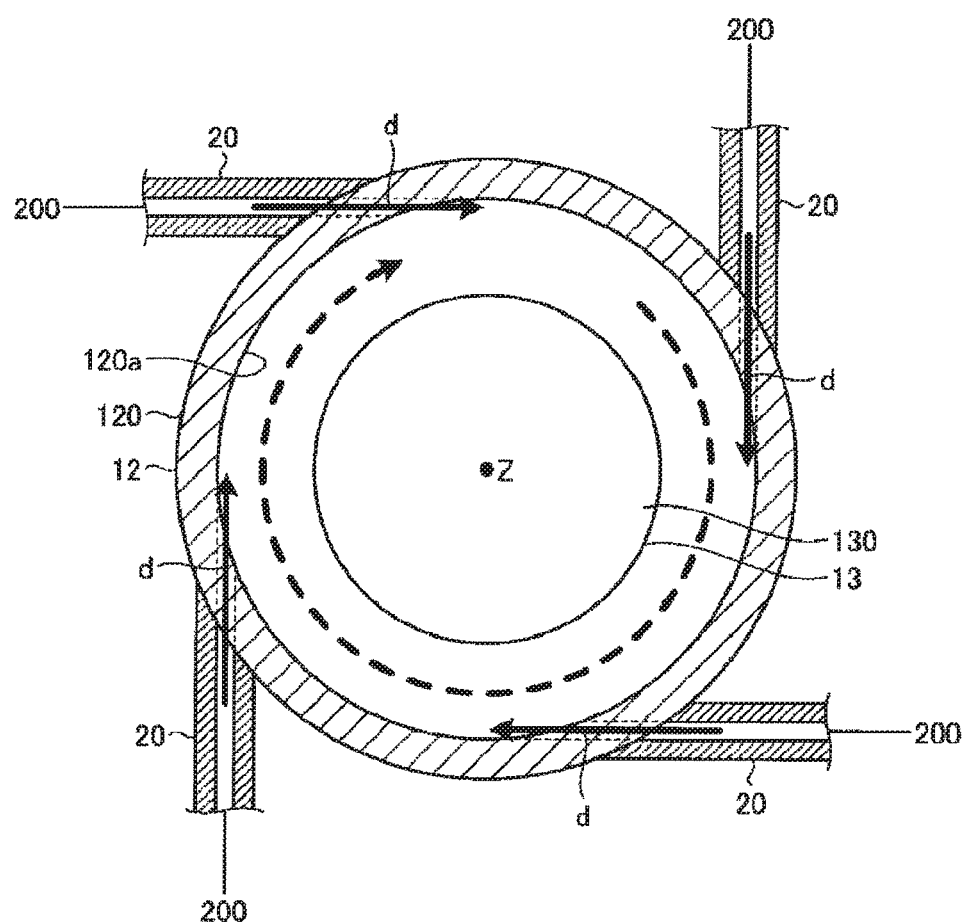
FIG. 2 is a cross-sectional view showing an example of an X-X cross-section of the plasma processing apparatus according to the first embodiment.

FIG. 1 is a schematic cross-sectional view showing an example of a plasma processing apparatus 10 according to a first embodiment. FIG. 2 is a cross-sectional view showing an example of an X-X cross-section of the plasma processing apparatus 10 according to the first embodiment. In the present embodiment, the plasma processing apparatus 10 is, e.g., a plasma etching apparatus including parallel plate electrodes. The plasma processing apparatus 10 is an example of a substrate processing apparatus. The plasma processing apparatus 10 includes an apparatus main body 11 and a controller 100.

The apparatus main body 11 includes a processing chamber 12 having a substantially cylindrical inner space. The substantially cylindrical inner space is defined by an inner wall surface 120a that is an inner surface of a sidewall 120 of the processing chamber 12. A central axis of the inner space of the processing chamber 12 is defined as a central axis Z.

A substantially cylindrical mounting table 13 for mounting thereon a semiconductor wafer W that is an example of a target substrate is disposed at a lower portion in the processing chamber 12. The semiconductor wafer W is mounted on a mounting surface 130 of the mounting table 13. An electrode 131 is disposed in the mounting table 13. A DC power supply 133 is connected to the electrode 131 through a switch 132. The electrode 131 generates an electrostatic force on the mounting surface 130 by a DC voltage supplied from the DC power supply 133 thereto through the switch 132. The semiconductor wafer W is attracted to and held on the mounting surface 130 by the electrostatic force generated by the electrode 131. The switch 132 is controlled by the controller 100.

A shower head 14 is disposed above the mounting table 13. The shower head 14 forms a part of a ceiling of the processing chamber 12. The shower head 14 has a ceiling plate holder 140 and a ceiling plate 141. A plurality of gas injection holes 142 is formed through the ceiling plate 141 in a thickness direction of the ceiling plate 141. The ceiling plate holder 140 holds the ceiling plate 141 from above. A recess is formed in a bottom surface of the ceiling plate holder 140. The gas injection holes 142 communicate with a diffusion space 143 surrounded by the recess of the ceiling plate holder 140 and the upper surface of the ceiling plate 141.

A line 15 is configured to supply therethrough a processing gas for plasma processing to be performed on the semiconductor wafer W into the diffusion space 143. The line 15 is connected to the ceiling plate holder 140. A gas supply source 152 is connected to the line 15 through a valve 150 and a flow rate controller 151. The gas supply source 152 is provided for supplying the processing gas therefrom. The flow rate controller 151 controls a flow rate of the processing gas supplied from the gas supply source 152 to the shower head 14 when the valve 150 is opened. The valve 150 and the flow rate controller 151 are controlled by the controller 100.

The processing gas whose flow rate is controlled by the flow rate controller 151 is supplied into the diffusion space 143 through the valve 150 and the line 15. The processing gas supplied into the diffusion space 143 is diffused in the diffusion space 143 and supplied in a shower pattern to a space between the ceiling plate 141 and the mounting table 13 through the gas injection holes 142.

An opening 121 for loading and unloading the semiconductor wafer W is formed at the sidewall 120 of the processing chamber 12. The opening 121 is opened and closed by a gate valve 122.

A gas exhaust line 16 is connected to the bottom portion of the processing chamber 12. An adaptive pressure control (APC) valve 160 and a ventilator 161 are connected to the gas exhaust line 16. The ventilator 161 exhausts the gas from the processing chamber 12 through the gas exhaust line 16 and the APC valve 160. The APC valve 160 adjusts a pressure in the processing chamber 12 by controlling the amount of gas exhausted by the ventilator 161. The APC valve 160 and the ventilator 161 are controlled by the controller 100.

A radio frequency power supply 135 is connected to the mounting table 13 through a matching unit 134. The radio frequency power supply 135 serves as a lower electrode and supplies a radio frequency power into the processing chamber 12. The matching unit 134 matches an output impedance of the radio frequency power supply 135 and an input impedance of a load side (the mounting table 13). The frequency or the magnitude of the radio frequency power supplied from the radio frequency power supply 135 is controlled by the controller 100.

The processing gas supplied in a shower pattern from the shower head 14 into the processing chamber 12 is excited by the radio frequency power supplied through the mounting table 13 into the processing chamber 12, and is turned into plasma. Then, a plasma processing such as etching or the like is performed on the semiconductor wafer W by ions or active species contained in the plasma.

When the plasma processing is performed in the processing chamber 12, deposits generated due to the plasma processing are adhered to the inner wall surface 120a of the sidewall 120 of the processing chamber 12 or the like. When the plasma processing is repeated in the processing chamber 12, the deposits adhered to the inner wall surface 120a or the like grow and become particles. The particles are scattered in the processing chamber 12 and contaminate the semiconductor wafer W. Therefore, in the present embodiment, after a predetermined number of semiconductor wafers W are processed, a purge gas is supplied into the processing chamber 12 in a state where no semiconductor wafer W is accommodated in the processing chamber 12. Accordingly, the deposits adhered to the inner wall surface 120a or the like are removed and exhausted by the purge gas, thereby reducing the amount of deposits in the processing chamber 12.

A plurality of lines (supply lines) 20 configured to supply the purge gas into the processing chamber 12 is disposed at different positions on the sidewall 120 of the processing chamber 12. A gas supply source 202 is connected to the respective lines 20 through a valve 200 and a flow rate controller 201. The gas supply source 202 is provided for supplying the purge gas therefrom. In the present embodiment, the purge gas is, e.g., nitrogen gas. Alternatively, as long as the purge gas is an inert gas, a rare gas, an oxygen gas or the like may be used as the purge gas other than nitrogen gas. When the valve 200 is opened, the flow rate controller 201 controls the flow rate of the purge gas to be supplied from the gas supply source 202 into the processing chamber 12 through the respective lines 20. The valve 200 and the flow rate controller 201 are controlled by the controller 100.

The controller 100 includes a processor, memory, and an input/output interface. The memory stores a program executed by the processor and recipes including processing conditions and the like. The processor executes the program read out from the memory and controls the respective components of the apparatus main body 11 through the input/output interface based on the recipes stored in the memory.

<Purge Gas Flow>

As shown in FIG. 2, for example, the lines 20 are disposed at positions on the sidewall 120 of the processing chamber 12. In the present embodiment, four lines 20 are disposed at different positions on the sidewall 120 of the processing chamber 12 at equal intervals along the inner wall surface 120a. The number of the lines 20 disposed at positions on the sidewall 120 of the processing chamber 12 may be one or more. The number of the lines 20 may be three or less, or may be five or more.

In the present embodiment, the lines 20 are configured to supply the purge gas in a direction d along the inner wall surface 120a of the processing chamber 12 in the processing chamber 12. When viewed from a direction along the central axis Z, the direction d is closer to, e.g., a tangential direction of the inner wall surface 120*a* than to an intermediate direction between the tangential direction of the inner wall surface 120*a* and a direction toward the central axis Z. In the present embodiment, as shown in FIG. 2, the direction d is, e.g., the tangential direction of the inner wall surface 120*a* when viewed from the direction along the central axis Z.

Figure 3:
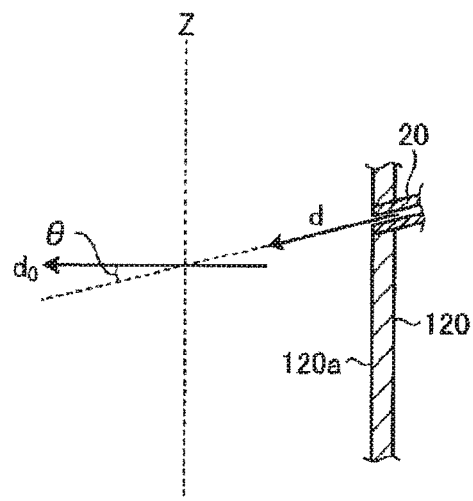
FIG. 3 shows an example of a supply direction of a gas supplied from a supply line.

Further, as shown in FIG. 3, each line 20 is configured to supply the purge gas in a sloped direction with respect to a direction do (e.g., horizontal direction) perpendicular to the central axis Z. FIG. 3 shows an example of a supply direction of the gas supplied from the line 20. In the present embodiment, through each line 20, the purge gas is supplied in a downwardly sloped direction with respect to the direction do. An angle θ formed by the direction do and the direction d in which the purge gas is supplied from each line 20 is greater than 0° and smaller than 45°, e.g., 30°.

Figure 4:
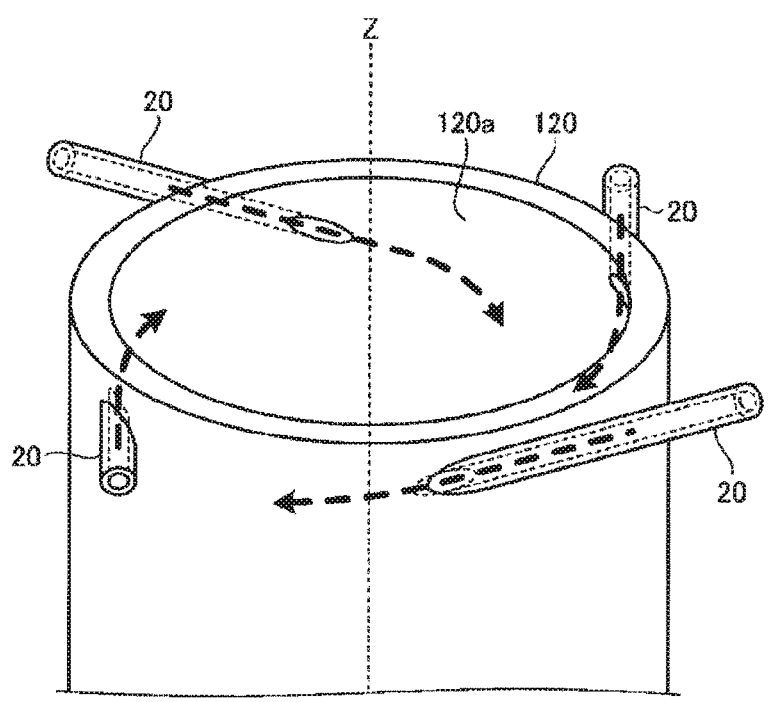
FIG. 4 shows an example of a flow of the gas supplied from the supply line.

The purge gas supplied into the processing chamber 12 is exhausted through the gas exhaust line 16 connected to the bottom portion of the processing chamber 12. Accordingly, downwardly sloped gas flow is generated in the processing chamber 12. When viewed from the shower head 14 toward the mounting table 13 along the central axis Z, swirl flow of the purge gas is generated in a clockwise direction along the inner wall surface 120*a* of the processing chamber 12 as shown in FIG. 4. FIG. 4 shows an example of the gas flow supplied from the lines 20.

In the present embodiment, the lines 20 disposed on the inner wall surface 120*a* are positioned close to the ceiling plate 141 above the mounting surface 130 of the mounting table 13 (that is, the lines 20 are arranged on the ceiling plate 141 side above the mounting surface 130 on the inner wall surface 120*a*). The ventilator 161 exhausts the gas from the processing chamber 12 through the gas exhaust line 16 disposed at the bottom portion of the processing chamber 12, which is positioned far away from the ceiling plate 141 below the mounting surface 130 of the mounting table 13. Accordingly, the swirl flow of the purge gas along the inner wall surface 120*a* can be quickly generated in a direction from the shower head 14 toward the mounting table 13 along the central axis Z.

<Simulation Result>

Figure 5:
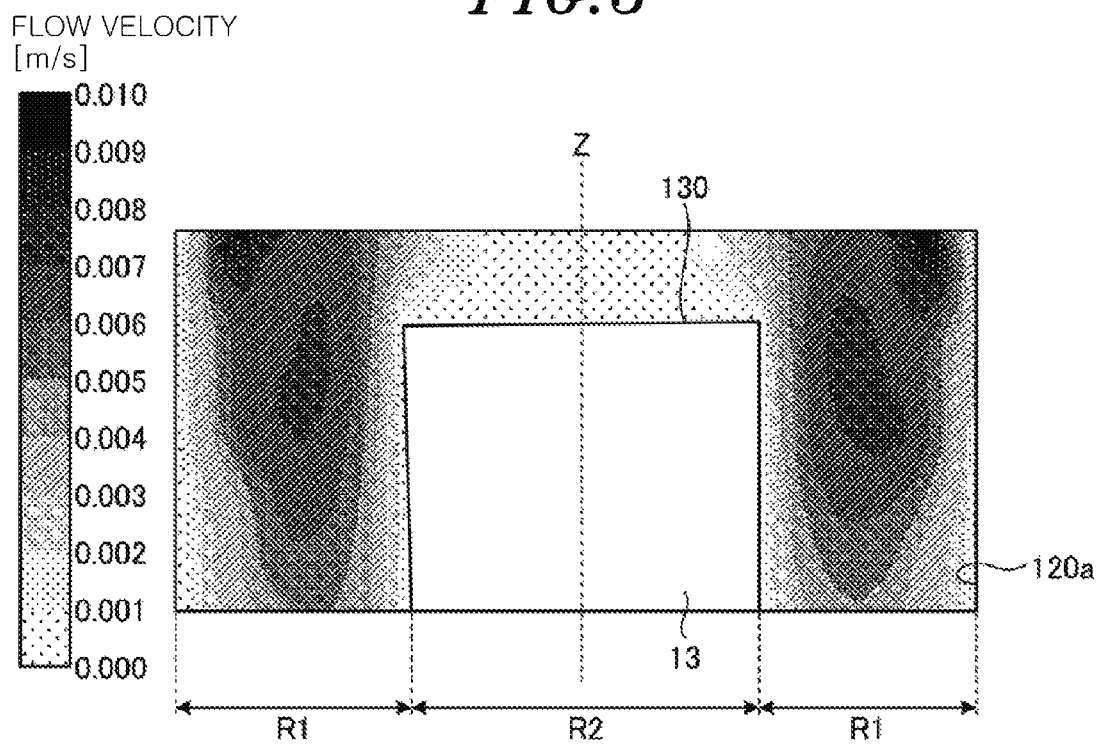
FIG. 5 shows an example of a flow velocity distribution of the gas supplied from the supply line.

FIG. 5 shows an example of flow velocity distribution of the gas supplied from the lines 20. As can be seen clearly from the simulation result of FIG. 5, the flow velocity of the gas supplied from the lines 20 is higher in a space far from the central axis Z than in a space above the mounting table 13. In other words, in a direction intersecting the central axis Z, a gas flow velocity in a first region R1 close to the inner wall surface 120*a* is higher than a gas flow velocity in a second region R2 where the mounting table 13 is disposed. In the example of FIG. 5, the direction intersecting the central axis Z is perpendicular to the central axis Z. Therefore, the deposits adhered to the inner wall surface 120*a* of the processing chamber 12 can be efficiently removed and exhausted by the purge gas.

<Cleaning Method>

Figure 6:
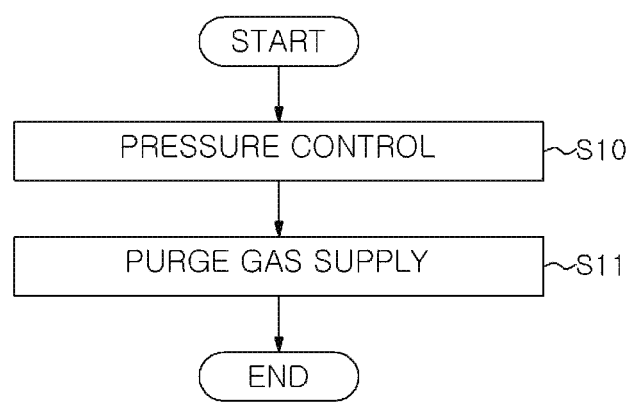
FIG. 6 is a flowchart showing an example of a cleaning method according to the first embodiment.

FIG. 6 is a flowchart showing an example of the cleaning method according to the first embodiment of the present disclosure. The cleaning method described in FIG. 6 is realized mainly by the controller 100 for controlling the respective components of the apparatus main body 11. For example, after the semiconductor wafer W processed by the plasma processing apparatus 10 is unloaded from the processing chamber 12, the controller 100 starts the processes shown in FIG. 6.

First, a pressure in the processing chamber 12 is controlled (step S10). Step S10 is an example of a pressure control process. In step S10, the controller 100 controls the valve 200 and the flow rate controller 201 to supply a purge gas at a small flow rate (e.g., several tens of sccm) from the lines 20 into the processing chamber 12, and also controls the APC valve 160 and the ventilator 161. Accordingly, the pressure in the processing chamber 12 is controlled to a predetermined pressure. In step S10, the controller 100 controls the pressure in the processing chamber 12 to a pressure (e.g., 10 Torr) between several Torr and several tens of Torr. In step S10, the ventilator 161 may evacuate the processing chamber 12 by opening the APC valve 160 without supplying the purge gas from the lines 20 into the processing chamber 12.

Next, a purge gas is supplied at a large flow rate into the processing chamber 12 (step S11). Step S11 is an example of a gas supply process. In step S11, the controller 100 controls the flow rate controller 201 to supply a purge gas at a large flow rate (e.g., several tens of slm) from the lines 20 into the processing chamber 12 for a predetermined period of time (e.g., several tens of seconds to several minutes). Therefore, the swirl flow of the purge gas along the inner wall surface 120*a* is generated in the processing chamber 12. Accordingly, the deposits adhered to the inner wall surface 120*a* are peeled off from the inner wall surface 120*a* and exhausted through the gas exhaust line 16 together with the purge gas. Then, the cleaning method described in FIG. 6 is terminated.

As described above, the plasma processing apparatus 10 according to the first embodiment includes the processing chamber 12, the mounting table 13, the lines 20, and the gas exhaust line 16. The processing chamber 12 has a substantially cylindrical inner space. The mounting table is disposed in the processing chamber 12 and mounts thereon the semiconductor wafer W. The lines 20 generate swirl gas flow in the processing chamber 12 by supplying a gas along the inner wall surface 120*a* that is an inner surface of the sidewall of the processing chamber 12. The gas in the processing chamber 12 is exhausted through the gas exhaust line 16. In a direction intersecting the central axis Z of the substantially cylindrical inner space, the gas flow velocity in the first region R1 close to the inner wall surface 120*a* is higher than the gas flow velocity in the second region R2 where the mounting table 13 is disposed. Accordingly, the deposit-removal efficiency in the cleaning process can be improved.

In the above-described embodiment, when viewed from the direction along the central axis Z, the lines 20 are configured to supply the gas in the tangential direction d of the inner wall surface 120*a* in the processing chamber 12 to generate the swirl gas flow in the processing chamber 12. Accordingly, the gas flow velocity near the inner wall surface 120*a* can be relatively higher, and thus the deposit-removal efficiency can be improved.

The plasma processing apparatus 10 according to the above-described embodiment includes the plurality of lines 20. When viewed from the direction along the central axis Z, the lines 20 through which the gas is supplied into the processing chamber 12 are disposed at different positions on the inner wall surface 120*a* that are spaced apart at equal intervals along the inner wall surface 120*a*. Therefore, the deviation of the gas flow velocity in the circumferential direction of the circle about the central axis Z can be reduced, and the deposits on the entire inner wall surface 120*a* in the circumferential direction can be efficiently removed.

In the above-described embodiment, the lines 20 are configured to supply the gas in a sloped direction with respect to the direction perpendicular to the central axis Z. Accordingly, the lines 20 can quickly generate the swirl gas flow in the processing chamber 12.

The plasma processing apparatus 10 according to the above-described embodiment includes the ceiling plate 141 disposed to face the mounting surface 130 of the mounting table 13 and the gas exhaust line 16 disposed at the bottom portion of the processing chamber 12, which is positioned far away from the ceiling plate 141 below the mounting surface 130. The lines 20 are disposed on the inner wall surface 120a, which are positioned close to the ceiling plate 141 above the mounting surface 130. The ventilator 161 exhausts the gas from the processing chamber 12 through the gas exhaust line 16. Therefore, the swirl flow of the purge gas along the inner wall surface 120a can be quickly generated in a direction from the shower head 14 toward the mounting table 13 along the central axis Z.

Figure 7:
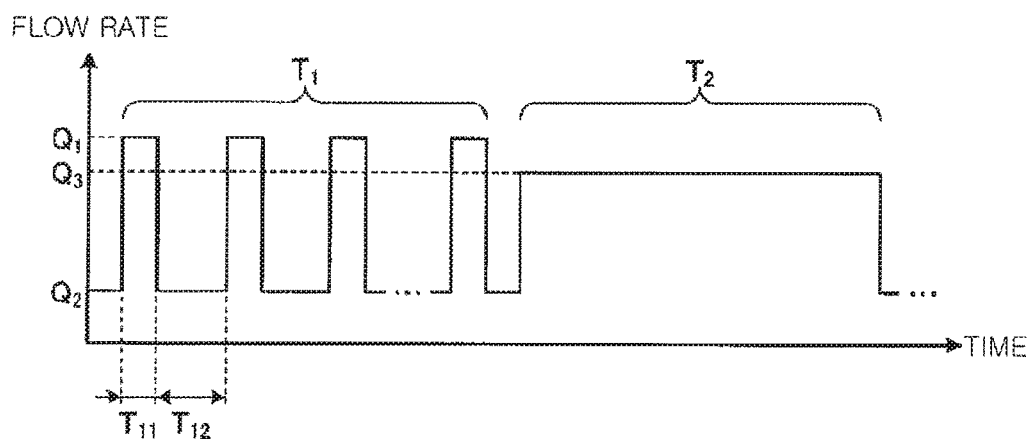
FIG. 7 shows an example of a flow rate control of the gas supplied from the supply line.

Further, the flow rate controller 201 may change the flow rate of the purge gas to be supplied into the processing chamber 12 through the lines 20, as shown in FIG. 7, for example. FIG. 7 shows an example of the flow rate control of the gas supplied from the lines 20.

For example, in a first period $T_1$, the flow rate of the purge gas supplied into the processing chamber 12 is alternated between a large flow rate $Q_1$ and a small flow rate $Q_2$. A period $T_{11}$ in which the purge gas is supplied at the large flow rate $Q_1$ and a period $T_{12}$ in which the purge gas is supplied at the small flow rate $Q_2$ may have the same length or different lengths. The small flow rate $Q_2$ may be, e.g., "0" (i.e., supply stop).

In the second period $T_2$, the purge gas is continuously supplied at a large flow rate $Q_3$ into the processing chamber 12. The large flow rate $Q_3$ in the second period $T_2$ may be equal to or different from the large flow rate $Q_1$ in the first period $T_1$.

Since the purge gas is supplied alternately at the large flow rate $Q_1$ and at the small flow rate $Q_2$ during the first period $T_1$, the deposits adhered to the inner wall surface 120a can be easily peeled off by the impact that occurs when the small flow rate $Q_2$ is switched to the large flow rate $Q_1$. Further, since the second period $T_2$ follows the first period $T_1$, the deposits peeled off from the inner wall surface 120a in the first period $T_1$ can be quickly discharged from the processing chamber 12 together with the purge gas.

It is preferred that the purge in the first period $T_1$ and the purge in the second period $T_2$ are alternately performed multiple times. The length of the first period $T_1$ and the length of the second period $T_2$ may be the same or different. The purge in the first period $T_1$ is an example of a first supply operation, and the purge in the second period $T_2$ is an example of a second supply operation.

The plasma processing apparatus 10 includes the flow rate controller 201 for controlling the flow rate of the gas to be supplied into the processing chamber 12 through the lines 20. The flow rate controller 201 may switch the gas flow rate in a pulsed manner. Accordingly, the deposits adhered to the inner wall surface 120a can be easily peeled off by the impact that occurs when the gas flow rate is switched from the small flow rate to the large flow rate. Further, the flow rate controller 201 may perform the first supply operation in which the flow rate of the gas supplied into the processing chamber 12 is switched in a pulsed manner, and then perform the second supply operation in which the gas is continuously supplied at a predetermined flow rate into the processing chamber 12. Accordingly, the deposits peeled off from the inner wall surface 120a in the first supply operation can be quickly discharged from the processing chamber 12 together with the purge gas in the second supply operation.

Second Embodiment

In the plasma processing apparatus 10 of the first embodiment, the lines 20 are disposed at different positions on the inner wall surface 120a and arranged on a plane (e.g., horizontal plane) intersecting the central axis Z. On the other hand, in the plasma processing apparatus 10 of the second embodiment, the lines 20 are disposed at different positions on the inner wall surface 120a but arranged in a direction (e.g., vertical direction) along the central axis Z. Hereinafter, the differences between the plasma processing apparatus of the second embodiment and the plasma processing apparatus 10 of the first embodiment will be mainly described.

Figure 8:
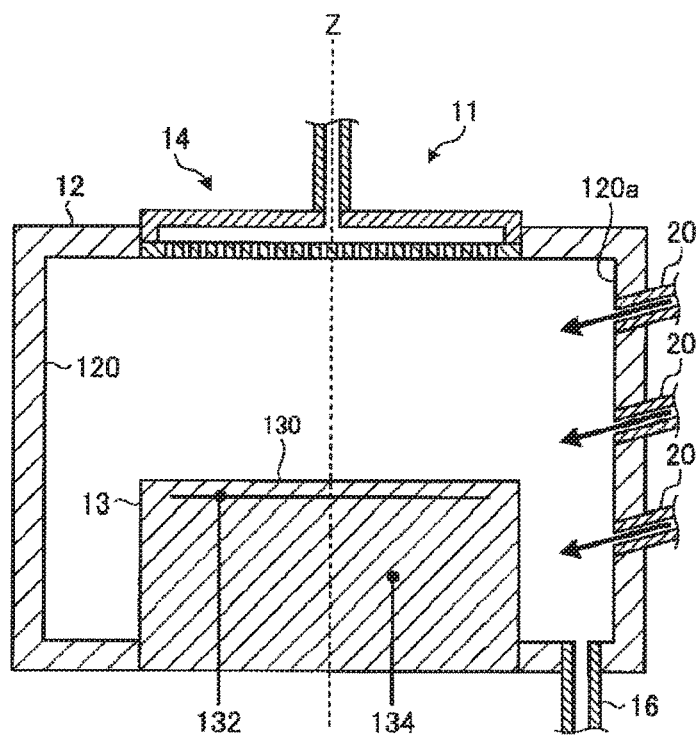
FIG. 8 is a cross-sectional view showing a main configuration of an example of an apparatus main body of a plasma processing apparatus according to a second embodiment of the present disclosure.

FIG. 8 is a cross-sectional view showing a main configuration of an example of the apparatus main body 11 in the second embodiment. In the present embodiment, as shown in FIG. 8, the lines 20 are arranged in a direction along the central axis Z on the inner wall surface 120a. Therefore, the flow velocity distribution of the purge gas in the direction along the central axis Z can become uniform. Accordingly, it is possible to effectively remove not only the deposits adhered to the inner wall surface 120a close to the shower head 14 above the mounting surface 130, but also the deposits adhered to the inner wall surface 120a close to the mounting surface 130 or the deposits adhered to the inner wall surface 120a close to the gas exhaust line 16 below the mounting surface 130.

In the processing chamber 12 of the present embodiment, the distance between the central axis Z and the inner wall surface 120a is substantially constant in the direction along the central axis Z. However, the present disclosure is not limited thereto. For example, the present disclosure can be applied to, e.g., a processing chamber 12 having a shape in which the distance between the central axis Z and the inner wall surface 120a is not constant in the direction along the central axis Z. Such a processing chamber 12 may be, e.g., a processing chamber 12 having a substantially spindle-shaped inner space in which a space near the mounting surface 130 of the mounting table 13 is wider than a space near the shower head 14 and the lines 15. The substantially spindle-shaped inner space can also be considered as an example of a substantially cylindrical inner space.

In the example of FIG. 8, the lines 20 are arranged on a straight line parallel to the central axis Z on the inner wall surface 120a. However, the present disclosure is not limited thereto. The lines 20 may be arranged at different positions when viewed from the direction along the central axis. In this case, the lines 20 may be spirally arranged on the inner wall surface 120a along the direction of the swirl flow of the purge gas generated in the processing chamber 12.

The lines 20 shown in FIG. 8 may be connected to valves 200 in a one-to-one correspondence to independently control the supply and the supply stop of the purge gas from the lines 20 into the processing chamber 12. For example, the purge gas supplied from the lines 20 into the processing chamber 12 may be controlled as shown in FIGS. 9A to 9C.

Figure 9:
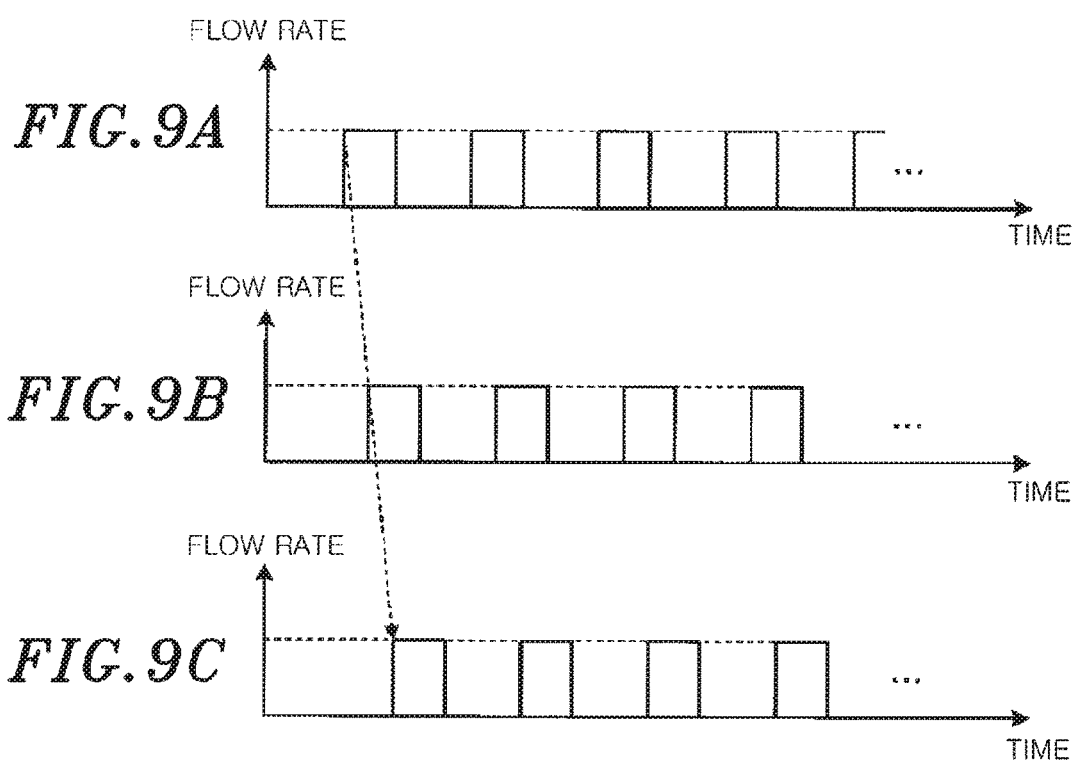
FIGS. 9A to 9C show examples of a flow rate control of a purge gas.

FIGS. 9A to 9C show examples of the flow rate control of the purge gas. For example, a first line 20 disposed at an upstream side of the swirl flow of the purge gas generated in the processing chamber 12 is configured to supply the purge gas into the processing chamber 12 in a pulsed manner at the timings shown in FIG. 9A. For example, a second line 20 disposed at a downstream side of the swirl flow of the purge gas compared to the first line 20 is configured to supply the purge gas into the processing chamber 12 in a pulsed manner at the timings shown in FIG. 9B. For example, a third line 20 disposed at the downstream side of the swirl flow of the purge gas compared to the second line 20 is configured to supply the purge gas into the processing chamber 12 in a pulsed manner at the timings shown in FIG. 9C. Therefore, the swirl flow of the pure gas can be generated in a uniformly pulsed manner in the processing chamber 12.

As described above, the plasma processing apparatus 10 of the second embodiment includes the plurality of lines 20. The lines 20 are configured to supply the gas into the processing chamber 12 at different positions when viewed from a direction perpendicular to the central axis Z.

Accordingly, the swirl flow of the purge gas can be uniformly generated in the processing chamber 12.

Third Embodiment

In the plasma processing apparatus 10 of the first embodiment, the swirl flow of the purge gas in one direction is generated in the processing chamber 12. On the other hand, in the plasma processing apparatus 10 of the third embodiment, the swirl flow of the purge gas in one direction and the swirl flow of the purge gas in the opposite direction are alternately generated in the processing chamber 12 at predetermined time intervals. Hereinafter, the differences between the plasma processing apparatus of the third embodiment and the plasma processing apparatus 10 of the first embodiment will be mainly described.

Figure 10:
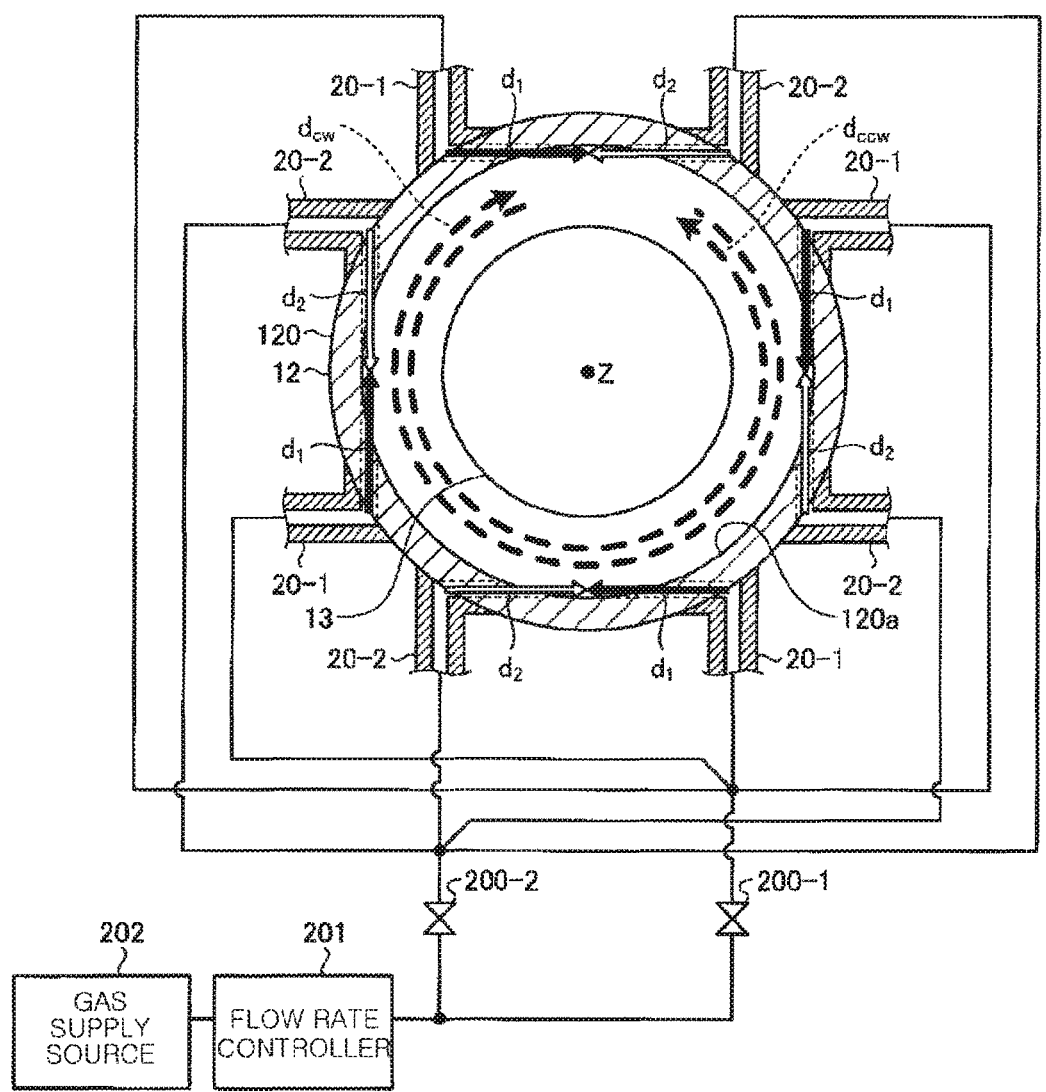
FIG. 10 is a cross-sectional view showing an example of an X-X cross-section of a plasma processing apparatus according to a third embodiment of the present disclosure.

FIG. 10 is a cross-sectional view showing an example of an X-X cross-section of the plasma processing apparatus 10 according to the third embodiment. A plurality of lines 20-1 and a plurality of lines 20-2 are disposed at different positions on the sidewall 120 of the processing chamber 12. In the present embodiment, four lines 20-1 are disposed at equal intervals along the inner wall surface 120a of the sidewall 120 of the processing chamber 12 and four lines 20-2 are disposed at equal intervals along the inner wall surface 120a of the sidewall 120 of the processing chamber 12. The number of the lines 20-1 and the number of the lines 20-2 disposed at positions on the sidewall 120 of the processing chamber 12 may be one or more. The number of the lines 20-1 and 20-2 may be three or less, or may be five or more.

A flow rate controller 201 is connected to each of the lines 20-1 through a valve 200-1 and is connected to each of the lines 20-2 through a valve 200-2. The valves 200-1 and 200-2 are examples of a switching unit.

The lines 20-1 are configured to supply the purge gas into the processing chamber 12 in a direction $d_1$ along the inner wall surface 120a (e.g., tangential direction of the inner wall surface 120a). Therefore, when viewed from a predetermined direction along the central axis Z, swirl flow is generated in a clockwise direction $d_{CW}$ in the processing chamber 12 along the inner wall surface 120a by the purge gas supplied from the lines 20-1. The predetermined direction is directed from the shower head 14 toward the mounting table 13, for example.

The lines 20-2 are configured to supply the purge gas into the processing chamber 12 in a direction $d_2$ along the inner wall surface 120a (e.g., tangential direction of the inner wall surface 120a). Therefore, when viewed from a predetermined direction along the central axis Z, swirl flow is generated in a counterclockwise direction $d_{CCW}$ in the processing chamber 12 along the inner wall surface 120a by the purge gas supplied from the lines 20-2.

FIGS. 11A and 11B show examples of a flow rate control of the purge gas. FIG. 11A shows changes in the flow rate of the purge gas supplied from the lines 20-1 into the processing chamber 12 and FIG. 11B shows changes in the flow rate of the purge gas supplied from the lines 20-2 into the processing chamber 12. The supply and the supply stop of the purge gas shown in FIG. 11A is controlled by the valve 200-1, and the supply and the supply stop of the purge gas shown in FIG. 11B is controlled by the valve 200-2.

For example, in a period $T_a$, the valve 200-1 is opened, and the purge gas is supplied from the lines 20-1 into the processing chamber 12. Accordingly, the swirl flow in the clockwise direction $d_{CW}$ is generated in the processing chamber 12 along the inner wall surface 120a.

Next, for example, in a period $T_b$, the valve 200-1 is closed and the supply of the purge gas from the lines 20-1 into the processing chamber 12 is stopped. Accordingly, the swirl flow in the clockwise direction $d_{CW}$ generated in the processing chamber 12 is gradually attenuated.

Next, for example, in a period $T_c$, the valve 200-2 is opened and the purge gas is supplied from the lines 20-2 into the processing chamber 12. Accordingly, the swirl flow in the counterclockwise direction $d_{CCW}$ is generated in the processing chamber 12 along the inner wall surface 120a.

Next, for example, in a period $T_d$, the valve 200-2 is closed, and the supply of the purge gas from the lines 20-2 into the processing chamber 12 is stopped. Accordingly, the swirl flow in the counterclockwise direction $d_{CCW}$ generated in the processing chamber 12 is gradually attenuated.

A length from the period $T_a$ to the period $T_d$ is about several seconds to several tens of seconds. For example, the length from the period $T_a$ to the period $T_d$ may be 10 seconds. In the present embodiment, the operations in the period $T_a$ to the period $T_d$ are repeated in that order a predetermined number of times (e.g., four cycles). The period $T_b$ and the period $T_d$ may be shorter than the period $T_a$ and the period $T_c$. The period $T_b$ and the period $T_d$ may not be provided, and the period $T_a$ and the period $T_c$ may be alternately repeated.

In the processing chamber 12, the swirl flow of the purge gas in the opposite direction is generated before the swirl flow of the purge gas generated in one direction disappears. Therefore, strong impact can be applied to the deposits adhered to the inner wall surface 120a. Further, by alternating the swirl flow of the purge gas in one direction and the swirl flow of the purge gas in the opposite direction, the deposits adhered to the inner wall surface 120a can be more efficiently peeled off from the inner wall surface 120a. Accordingly, the deposit-removal efficiency in the cleaning process can be improved.

As described above, the plasma processing apparatus 10 of the third embodiment includes the plurality of lines 20-1 and the plurality of lines 20-2. The lines 20-1 are configured to generate the swirl gas flow in the clockwise direction when viewed from a predetermined direction along the central axis Z. The lines 20-2 are configured to generate the swirl gas flow in the counterclockwise direction when viewed from a predetermined direction along the central axis Z. The plasma processing apparatus 10 further includes the valves 200-1 and 200-2. The valves 200-1 and 200-2 switch the supply line for supplying the gas into the processing chamber 12 between the lines 20-1 and the lines 20-2 at predetermined time intervals. Accordingly, the deposit-removal efficiency in the cleaning can be improved.

Other Applications

The present disclosure is not limited to the above-described embodiments, and various modifications can be made within the scope of the appended claims and the gist thereof.

For example, in the first embodiment, the lines 20 are disposed at positions on the inner wall surface 120a close to the shower head 14 above the mounting surface 130 of the mounting table 13. However, the present disclosure is not limited thereto. For example, the lines 20 may be disposed at positions on the inner wall surface 12 close to the gas exhaust line 16 below the mounting surface 130 of the mounting table 13 (that is, the lines 20 are arranged on the gas exhaust line 16 side below the mounting surface 130 on the inner wall surface 120a). In this case, the lines 20 are configured to supply the purge gas in a direction upwardly sloped toward the shower head 14 when viewed from the direction perpendicular to the central axis Z. Due to the purge gas supplied from the lines 20, the swirl flow is generated along the inner wall surface 120a from the space close to the gas exhaust line 16 below the mounting surface 130 toward the space close to the shower head 14 above the mounting surface 130, and the deposits adhered to the wall surface 120a are removed. The purge gas that has reached the vicinity of the shower head 14 flows toward the gas exhaust line 16 and is exhausted through the gas exhaust line 16. In this case, a gas exhaust port different from the gas exhaust line 16 may be disposed near the shower head 14, and the purge gas may be exhausted through the separate exhaust port during the cleaning process.

In the above-described embodiments, the lines 20 are configured to supply the purge gas in a sloped direction with respect to a direction (e.g., the horizontal direction) perpendicular to the central axis Z. However, the present disclosure is not limited thereto, and the lines 20 may be configured to supply the purge gas in a direction (e.g., the horizontal direction) parallel to the direction perpendicular to the central axis Z. In this case as well, the purge gas supplied from the lines 20 into the processing chamber 12 is exhausted through the gas exhaust line 16 disposed at a position different from those of the lines 20 in the direction along the central axis Z. Therefore, the swirl flow directed from the lines 20 toward the gas exhaust line 16 can be generated between the lines 20 and the gas exhaust line 16.

In the first embodiment, the lines 20 are disposed at positions on the inner wall surface 120a close to the shower head 14 above the mounting surface 130 of the mounting table 13 and configured to supply the purge gas in a direction sloped toward the mounting surface 130 with respect to the direction (e.g., the horizontal direction) perpendicular to the central axis Z. However, the present disclosure is not limited thereto. For example, the lines 20 may be disposed at positions on the inner wall surface 120a close to the shower head 14 above the mounting surface 130 of the mounting table 13 and configured to supply the purge gas in a direction sloped toward the ceiling plate 141 of the shower head 14 with respect to the direction (e.g., the horizontal direction) perpendicular to the central axis Z. Accordingly, it is possible to effectively remove not only the deposits adhered to the inner wall surface 120a but also the deposits adhered to the surface of the ceiling plate 141 which faces the mounting surface 130.

In the third embodiment, when viewed from the direction along the central axis Z, the swirl flow of the purge gas in one direction and the swirl flow of the purge gas in the opposite direction are switched at predetermined time intervals. However, the present disclosure is not limited thereto. For example, the swirl flow of the purge gas from the shower head 14 toward the mounting table 13 and the swirl flow of the purge gas from the mounting table 13 toward the shower head 14 may be switched at predetermined time intervals.

In this case, the lines 20 for supplying the purge gas in a direction sloped toward the gas exhaust line 16 with respect to the direction perpendicular to the central axis Z are disposed at positions on the inner wall surface 120a close to the shower head 14 above the mounting surface 130 and connected to the valve 200-1. Further, the lines 20 for supplying the purge gas in a direction sloped toward the shower head 14 with respect to the direction perpendicular to the central axis Z are disposed at positions on the inner wall surface 120a close to the gas exhaust line 16 below the mounting surface 130 and connected to the valve 200-2. In addition, a gas exhaust port different from the gas exhaust line 16 is disposed near the shower head 14.

When the valve 200-1 is opened, the purge gas supplied from the lines 20 connected to the valve 200-1 generates the swirl flow directed from the shower head 14 toward the mounting table 13, and is exhausted through the gas exhaust line 16. When the valve 200-2 is opened, the purge gas supplied from the lines 20 connected to the valve 200-2 generates the swirl flow directed from the mounting table 13 toward the shower head 14, and is exhausted from another gas exhaust port disposed near the shower head 14. In this case as well, the deposit-removal efficiency in the cleaning process can be improved.

The switching of the direction of the swirl flow of the purge gas when viewed from the direction along the central axis Z may be combined with the switching of the direction of the swirl flow of the purge gas when viewed from the direction perpendicular to the central axis Z. Accordingly, the deposit-removal efficiency in the cleaning process can be further improved.

Further, although the NPPC cleaning has been described in the above embodiments, the present disclosure is not limited thereto. For example, in the cleaning using plasma, the technique described in the above embodiments can be applied to the flow of the cleaning gas.

Although the cleaning process in the plasma processing apparatus 10 has been described in the above embodiments, the present disclosure is not limited thereto. The technique described in the above embodiments can be applied to a cleaning process in a processing apparatus that does not use plasma.

The gas exhaust line 16 may be connected to the gas exhaust port formed at a position on the inner wall surface 120a to exhaust the gas from the processing chamber 12 along the inner wall surface 120a. In this case, a portion of the gas exhaust line 16 near the connection portion with the gas exhaust port extends in a direction along the inner wall surface 120a.

Therefore, the purge gas supplied from the lines 20 along the inner wall surface 120a is exhausted along the inner wall surface 120a through the gas exhaust port. Accordingly, the swirl flow of the purge gas having a high flow velocity can be generated in the processing chamber 12, which makes it possible to further improve the deposit-removal efficiency in the cleaning process.

The embodiments of the present disclosure are illustrative in all respects and are not restrictive. The above-described embodiments can be embodied in various forms. Further, the above-described embodiments may be omitted, remounted, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. An apparatus for processing a target substrate comprising:
a processing chamber having a substantially cylindrical inner space;
a mounting table disposed in the processing chamber and configured to mount thereon the target substrate;
at least one supply line directed in a downwardly sloped direction with respect to a horizontal direction of the processing chamber, the at least one supply line configured to supply a gas in the downwardly sloped direction, and in a direction along an inner wall surface of a sidewall of the processing chamber to generate a swirl flow of the gas in the processing chamber, the inner wall surface facing the substantially cylindrical inner space;
a gas exhaust line disposed at a bottom portion of the processing chamber, and
a ventilator configured to exhaust the gas from the processing chamber through the gas exhaust line,
wherein, in a direction intersecting an axis of the substantially cylindrical inner space, a flow velocity of the gas in a first region close to the inner wall surface is higher than a flow velocity of the gas in a second region where the mounting table is disposed.

2. The apparatus of claim 1, wherein the at least one supply line is configured to supply the gas in a tangential direction of the inner wall surface in the processing chamber when viewed from a direction along the axis to generate the swirl flow of the gas in the processing chamber.

3. The apparatus of claim 1, wherein the at least one supply line includes two or more supply lines,
wherein when viewed from the direction along the axis, the two or more supply lines are disposed at different positions on the inner wall surface that are spaced at equal intervals along the inner wall surface to supply the gas into the processing chamber.

4. The apparatus of claim 1, wherein the at least one supply line includes two or more supply lines,
wherein when viewed from a direction perpendicular to the axis, the two or more supply lines are disposed at different positions on the inner wall surface that are spaced at equal intervals along the inner wall surface to supply the gas into the processing chamber.

5. The apparatus of claim 1, further comprising:
a flow rate controller configured to control a flow rate of the gas supplied into the processing chamber through the at least one supply line,
wherein the flow rate controller switches the flow rate of the gas supplied into the processing chamber in a pulsed manner.

6. The apparatus of claim 5, wherein the flow rate controller performs a first supply operation in which the flow rate of the gas supplied into the processing chamber is switched in a pulsed manner, and then performs a second supply operation in which the gas is continuously supplied into the processing chamber at a predetermined flow rate.

7. The apparatus of claim 1, further comprising:
a ceiling plate disposed to face a mounting surface of the mounting table;
wherein the gas exhaust line is positioned far away from the ceiling plate below the mounting surface,
wherein the at least one supply line is disposed at a position on the inner wall surface close to the gas exhaust line below the mounting surface.

8. The apparatus of claim 1, further comprising:
a ceiling plate disposed to face a mounting surface of the mounting table;
wherein the gas exhaust line is positioned far away from the ceiling plate below the mounting surface,
wherein the at least one supply line is disposed at a position on the inner wall surface close to the ceiling plate above the mounting surface.

9. The apparatus of claim 1, wherein the at least one supply line includes two or more supply lines,
wherein the two or more supply lines include
a first supply line configured to generate a swirl flow of the gas in a clockwise direction when viewed from a predetermined direction along the axis;
a second supply line configured to generate a swirl flow of the gas in a counterclockwise direction when viewed from the predetermined direction, and
wherein the apparatus further comprises:
a switching unit configured to switch the two or more supply lines configured to supply the gas into the processing chamber between the first supply line and the second supply line at predetermined time intervals.

10. The apparatus of claim 1, wherein the at least one supply line includes two or more supply lines,
wherein the two or more supply lines are configured to supply the gas into the processing chamber at different positions along the inner wall surface.

11. The apparatus of claim 1, wherein the at least one supply line includes two or more supply lines,
wherein the two or more supply lines are configured to supply the gas into the processing chamber at different positions along the inner wall surface at the same time or different times.

12. The apparatus of claim 1, further comprising:
a shower head for supplying a processing gas disposed above the mounting table,
wherein the at least one supply line includes
a third supply line configured to generate a swirl flow of the gas in a direction directed from the shower head toward the mounting table; and
a fourth supply line configured to generate a swirl flow of the gas in a direction directed from the mounting table toward the shower head;
wherein the apparatus further comprises:
a switching unit configured to switch the supply lines configured to supply the gas into the processing chamber between the third supply line and the fourth supply line at predetermined time intervals.

13. The apparatus of claim 1, further comprising:
a shower head for supplying a processing gas disposed above the mounting table,
wherein the at least one supply line includes
a first supply line configured to generate a swirl flow of the gas in a clockwise direction when viewed from a predetermined direction along the axis;
a second supply line configured to generate a swirl flow of the gas in a counterclockwise direction when viewed from the predetermined direction;

a third supply line configured to generate a swirl flow of the gas in a direction directed from the shower head toward the mounting table; and a fourth supply line configured to generate a swirl flow of the gas in a direction directed from the mounting table toward the shower head, wherein the apparatus further comprises:

a switching unit configured to switch the supply lines configured to supply the gas into the processing chamber among the first supply line, the second supply line, the third supply line and the fourth supply line at predetermined time intervals.

14. A cleaning method for a substrate processing apparatus including:

provinding a processing chamber having a substantially cylindrical inner space, a mounting table disposed in the processing chamber to mount thereon a target substrate, at least one supply line directed in a downwardly sloped direction with respect to a horizontal direction of the process chamber, the at least one supply line configured to supply a gas into the processing chamber in the downwardly sloped direction, a gas exhaust line disposed at a bottom portion of the processing chamber, and a ventilator configured to exhaust the gas in the processing chamber through the gas exhaust line;

controlling a pressure in the processing chamber by supplying the gas from the at least one supply line into the processing chamber while exhausting the gas from the processing chamber using the ventilator; and supplying the gas along an inner wall surface of a sidewall of the processing chamber to generate a swirl flow of the gas in the processing chamber, the inner wall surface facing the substantially cylindrical inner space, wherein in said supplying the gas, in a direction intersecting an axis of the substantially cylindrical processing chamber, a flow velocity of the gas in a first region close to the inner wall surface of the processing chamber is higher than a flow velocity of the gas in a second region where the mounting table is disposed.

* * * * *